(12) United States Patent
Han et al.

(10) Patent No.: US 8,519,317 B2
(45) Date of Patent: Aug. 27, 2013

(54) PHOTOSENSOR, MANUFACTURING METHOD THEREOF, AND LIQUID CRYSTAL DISPLAY INCLUDING A PHOTOSENSOR

(75) Inventors: Sang-Youn Han, Seoul (KR); Sung-Hoon Yang, Seoul (KR); Suk-Won Jung, Goyang-si (KR); Kyung-Sook Jeon, Yongin-si (KR); Seung Mi Seo, Seoul (KR); Mi-Seon Seo, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 397 days.

(21) Appl. No.: 12/960,245

(22) Filed: Dec. 3, 2010

(65) Prior Publication Data

US 2012/0033161 A1    Feb. 9, 2012

(30) Foreign Application Priority Data

Aug. 9, 2010  (KR) .................. 10-2010-0076620

(51) Int. Cl.
*G02F 1/1335*  (2006.01)
*H01L 31/20*  (2006.01)

(52) U.S. Cl.
USPC .................. 250/208.1; 349/106; 345/207

(58) Field of Classification Search
USPC .................. 250/208.1; 349/106; 345/207
See application file for complete search history.

(56) References Cited

U.S. PATENT DOCUMENTS

| 7,282,382 B2 | 10/2007 | Rieve et al. |
| 8,054,304 B2 * | 11/2011 | Lin et al. .................. 345/207 |
| 2005/0094067 A1 * | 5/2005 | Sakamoto et al. ............ 349/114 |
| 2009/0242429 A1 | 10/2009 | Sitdikov et al. |
| 2009/0278048 A1 | 11/2009 | Choe et al. |
| 2010/0038540 A1 | 2/2010 | Hannebauer |

FOREIGN PATENT DOCUMENTS

| JP | 3420555 | 4/2003 |
| JP | 2007329227 | 12/2007 |
| JP | 2006210701 | 8/2008 |
| KR | 20100800310 | 1/2008 |

* cited by examiner

*Primary Examiner* — Tony Ko
(74) *Attorney, Agent, or Firm* — H.C. Park & Associates, PLC

(57) ABSTRACT

A photosensor includes a substrate, a gate line, and a data line disposed on the substrate. A thin film transistor is connected to the gate line and the data line. A first photo-sensing member is disposed on the substrate, and a first electrode is connected to the thin film transistor and the first photo-sensing member. A second photo-sensing member is disposed on the first photo-sensing member, and a second electrode is connected to the first electrode and the second photo-sensing member.

21 Claims, 16 Drawing Sheets

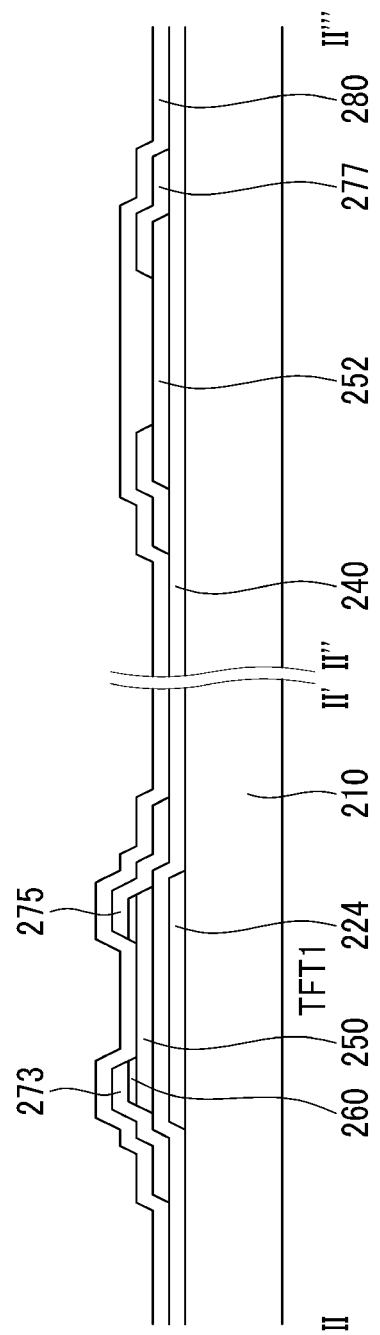

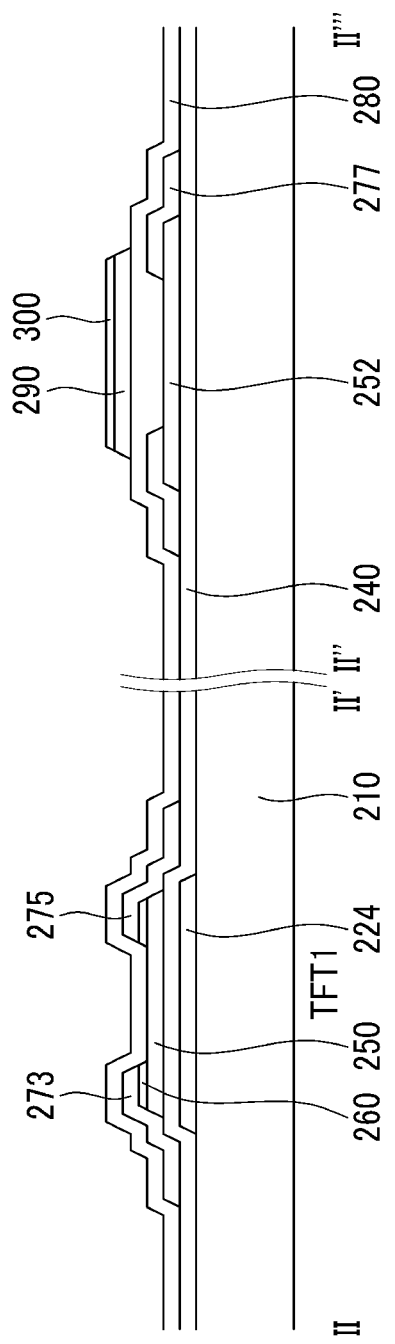

PHOTOSENSOR, MANUFACTURING METHOD THEREOF, AND LIQUID CRYSTAL DISPLAY INCLUDING A PHOTOSENSOR

CROSS-REFERENCE TO RELATED APPLICATION

This application claims priority to and the benefit of Korean Patent Application No. 10-2010-0076620, filed on Aug. 9, 2010, which is hereby incorporated by reference for all purposes as if fully set forth herein.

BACKGROUND OF THE INVENTION

1. Field of the Invention

Exemplary embodiments of the present invention relate to a photosensor, a method of manufacturing a photosensor, and a liquid crystal display including a photosensor. More particularly, exemplary embodiments of the present invention relate to a photosensor, a method of manufacturing a photosensor, and a liquid crystal display including a photosensor to improve a sensing resolution and an aperture ratio, and to minimize an influence of visible rays for an infrared sensing sensor.

2. Description of the Related Art

Liquid crystal displays (LCDs) are one of the most widely used flat panel displays. An LCD typically includes a pair of panels provided with field-generating electrodes and a liquid crystal (LC) layer interposed between the two panels. The LCD displays images by applying signals to the field-generating electrodes to generate an electric field in the LC layer that determines the orientation of LC molecules therein to adjust polarization of incident light.

Recently, research has been underway on liquid crystal displays additionally having a touch sensing function or an image sensing function. To realize the touch sensing function and the image sensing function, a light sensor including an infrared ray sensor and a visible ray sensor may be added to the liquid crystal display.

However, a touch sensing capacity and an image sensing capacity should be increased in view of the increasing resolution of the liquid crystal display. However, there is a limit to reduce the size of an infrared sensing sensor and a visible ray sensing sensor.

Also, a problem may occur where the infrared sensing sensor may react with visible rays as well as infrared rays.

The above information disclosed in this Background section is only for enhancement of understanding of the background of the invention and therefore it may contain information that does not form the prior art that is already known in this country to a person of ordinary skill in the art.

SUMMARY OF THE INVENTION

Exemplary embodiments of the present invention provide a photosensor, a method of manufacturing a photosensor, and a liquid crystal display including a photosensor that may have improved sensing resolution and sensing of visible rays and infrared rays.

Exemplary embodiments of the present invention also provide a photosensor, a method of manufacturing a photosensor, and a liquid crystal display including a photosensor that may have an increased aperture ratio by omitting a storage capacitor in constituent elements.

Exemplary embodiments of the present invention also provide a photosensor, a method of manufacturing a photosensor, and a liquid crystal display including a photosensor that may be capable of minimizing the influence of visible rays on the infrared sensor while sensing the visible rays and the infrared rays in one pixel.

An exemplary embodiment of the present invention discloses a photosensor that includes: a substrate; a gate line and a data line disposed on the substrate; a thin film transistor connected to the gate line and the data line; a first photo-sensing member disposed on the substrate; a first electrode connected to the thin film transistor and the first photo-sensing member; a second photo-sensing member disposed on the first photo-sensing member; and a second electrode connected to the first electrode and the second photo-sensing member.

An exemplary embodiment of the present invention also discloses a photosensor that includes: a substrate; a gate line and a data line disposed on the substrate; a thin film transistor (TFT) connected to the gate line and the data line and including a gate electrode, a first TFT electrode, and a second TFT electrode; a first photo-sensing member disposed on the substrate; a first electrode disposed on and enclosing the first photo-sensing member and connected to the first TFT electrode; an insulating layer disposed on the thin film transistor, the first photo-sensing member, and the first electrode; a second photo-sensing member disposed on the insulating layer; and a second electrode disposed on and enclosing the second photo-sensing member on the second photo-sensing member and connected to the first electrode.

An exemplary embodiment of the present invention also discloses a manufacturing method that includes: forming a gate electrode on a substrate; forming a first insulating layer on the substrate comprising the gate electrode; forming a semiconductor layer and a first photo-sensing member on the first insulating layer and an ohmic contact layer on the semiconductor layer; forming a source electrode and a drain electrode spaced apart from each other on the ohmic contact layer, and a first electrode on the first photo-sensing member, and removing a portion of the ohmic contact layer disposed between the source electrode and the drain electrode; forming a second insulating layer on the source electrode, the drain electrode, the first photo-sensing member, and the first electrode; forming a second photo-sensing member on the second insulating layer; and forming a second electrode connected to the first electrode and on the second photo-sensing member.

An exemplary embodiment of the present invention also discloses a liquid crystal display including a photo sensor. The liquid crystal display includes: a first substrate and a second substrate facing each other and comprising a plurality of pixels; a first gate line and a first data line disposed on the first substrate; a first thin film transistor connected to the first gate line and the first data line; a first photo-sensing member disposed on the first substrate; a first electrode disposed on and enclosing the first photo-sensing member and connected to the first thin film transistor; an insulating layer disposed on the first photo-sensing member and the first electrode; a second photo-sensing member disposed on the insulating layer; a second electrode disposed on and enclosing the second photo-sensing member and connected to the first electrode; a second gate line and a second data line disposed on the second substrate; a second thin film transistor connected to the second gate line and the second data line; a pixel electrode connected to the second thin film transistor and disposed in a pixel; and a liquid crystal layer disposed between the first substrate and the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 7A, FIG. 7B, FIG. 7C, FIG. 7D, FIG. 7E, FIG. 7F, FIG. 7G, FIG. 7H, and FIG. 7I are cross-sectional views showing a manufacturing method of a photosensor according to an exemplary embodiment of the present invention.

DETAILED DESCRIPTION OF THE ILLUSTRATED EMBODIMENTS

Figure 1:
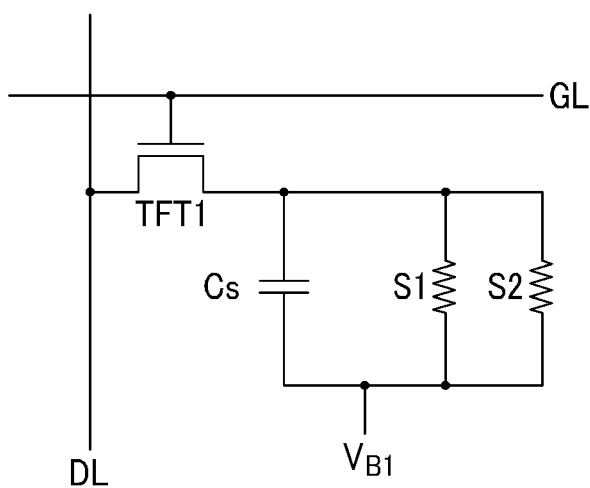
FIG. 1 is a circuit diagram of a photosensor according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Firstly, a photosensor according to an exemplary embodiment of the present invention will be described with reference to the accompanying drawings.

FIG. 1 is a circuit diagram of a photosensor according to an exemplary embodiment of the present invention.

A photosensor according to an exemplary embodiment of the present invention includes a gate line GL and a data line DL insulated from and intersecting each other, a first thin film transistor TFT1 connected to the gate line GL and the data line DL, and an infrared sensing sensor S1 and a visible ray sensing sensor S2 connected to the first thin film transistor TFT1. The infrared sensing sensor S1 and the visible ray sensing sensor S2 are connected to a voltage supply line VB1, which supplies a bias voltage.

Also, the photosensor according to an exemplary embodiment of the present invention may include a storage capacitor Cs having one terminal connected to the voltage supply line VB1 and the other terminal connected to the first thin film transistor TFT1. However, the infrared sensing sensor S1 and the visible ray sensing sensor S2 of the present invention do not use a thin film transistor, but use a conductor as a means of sensing the light such that the storage capacitor Cs may be omitted in the constituent elements.

Hereinafter, a photosensor according to an exemplary embodiment of the present invention will be described in detail with reference to the accompanying drawings.

Figure 2:
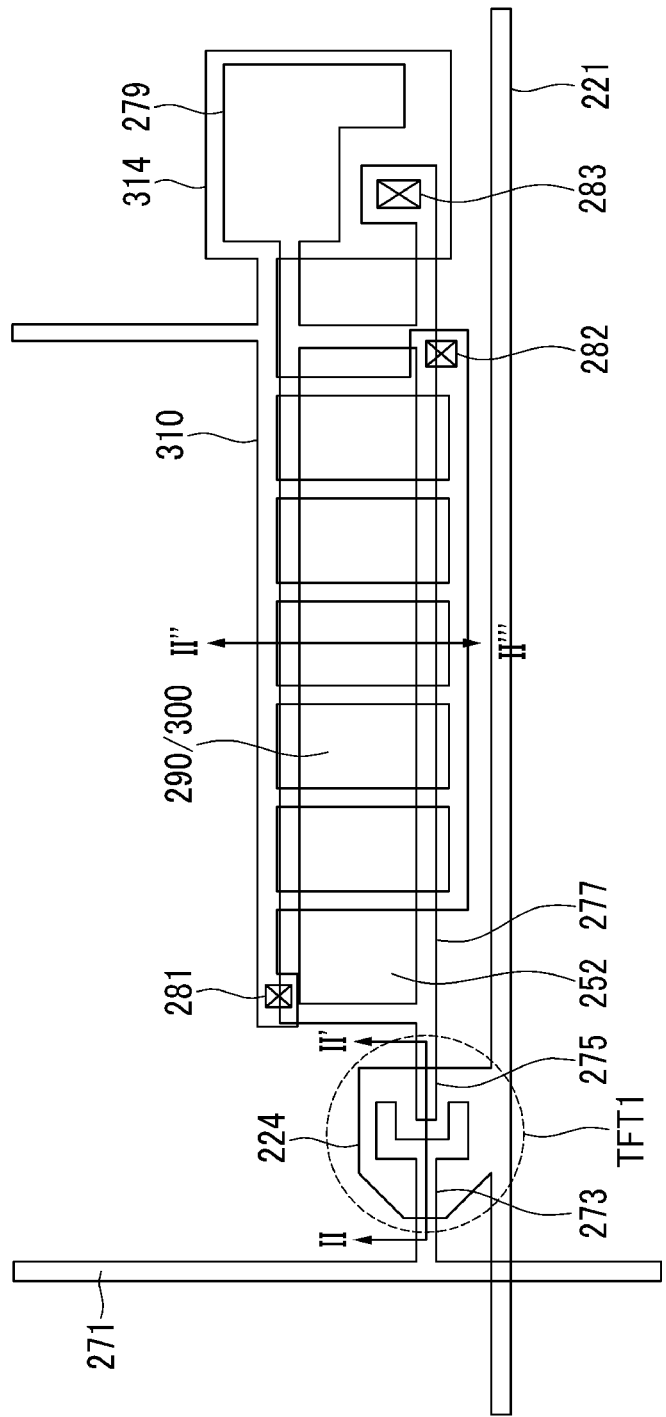
FIG. 2 is a top plan view of a photosensor according to an exemplary embodiment of the present invention.
Figure 3:
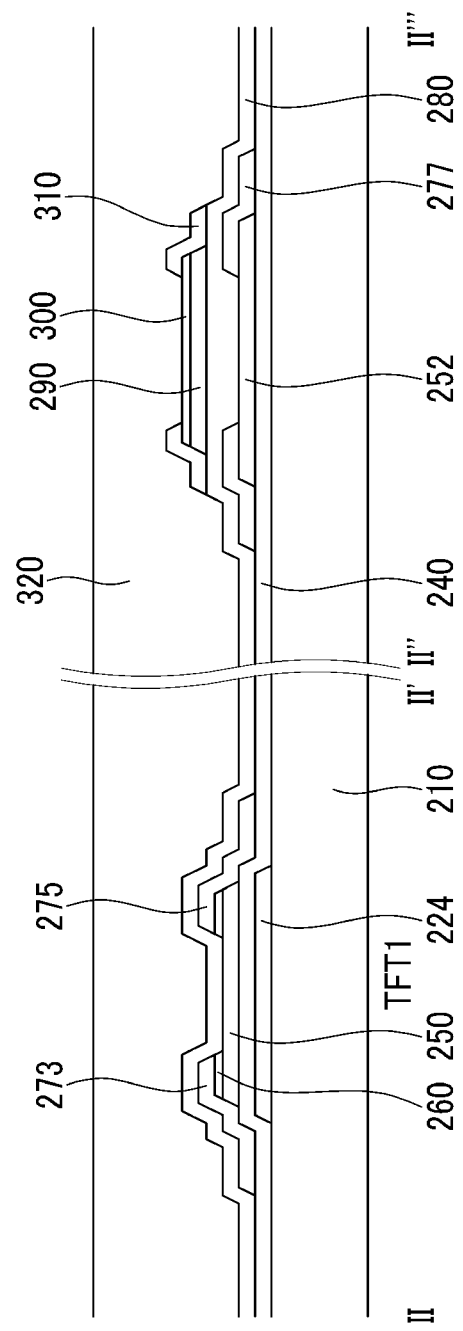
FIG. 3 is a cross-sectional view taken along lines II-II' and II"-II'" of FIG. 2.

FIG. 2 is a top plan view of a photosensor according to an exemplary embodiment of the present invention, and FIG. 3 is a cross-sectional view taken along lines II-II' and line II"-II'" of FIG. 2.

A photosensor according to an exemplary embodiment of the present invention includes a first substrate 210, which may be made of transparent glass or plastic, a gate line 221 and a data line 271 formed on the first substrate 210 and insulated from and intersecting each other, a first thin film transistor TFT1 connected to the gate line 221 and the data line 271, a first photo-sensing member 252 formed on the first substrate 210, a first electrode 277 connected to the first photo-sensing member 252, a first passivation layer 280 formed on the first thin film transistor TFT1, the first photo-sensing member 252, and the first electrode 277, a second photo-sensing member 300 formed on the first passivation layer 280, and a second electrode 310 connected to the second photo-sensing member 300.

The first thin film transistor TFT1 includes a first gate electrode 224 protruded from the gate line 221, a first source electrode 273 protruded from the data line 271 toward the first gate electrode 224, and a first drain electrode 275 spaced apart from the first source electrode 273.

A first gate insulating layer 240 is formed on the whole surface of the first substrate 210 including the first gate electrode 224, an island-shaped first semiconductor layer 250 is formed on the first gate insulating layer 240 at a position corresponding to the first gate electrode 224, and a pair of first ohmic contact layers 260 facing each other are formed on the first semiconductor layer 250.

The first photo-sensing member 252 is formed on the first substrate 210 to be disposed close to the first thin film transistor TFT1.

The first electrode 277 is formed on the first photo-sensing member 252 to enclose the first photo-sensing member 252, and it is connected to the first drain electrode 275 of the first thin film transistor TFT1.

The second photo-sensing member 300 is formed on the first passivation layer 280 in a position that corresponds to the position of the first photo-sensing member 252.

The second electrode 310 is formed on the second photo-sensing member 300 to enclose the second photo-sensing member 300.

The first passivation layer 280 may have at least one of first contact holes 281 and 282 overlapping the first electrode 277 and the second electrode 310, and the first electrode 277 and the second electrode 310 are connected to each other through the first contact holes 281 and 282.

The first photo-sensing member 252 and the first electrode 277 may sense incident visible rays, and the second photo-sensing member 300 and the second electrode 310 may sense incident infrared rays. The principle of sensing the infrared rays and the visible rays will be described with reference to FIG. 4, FIG. 5, and Table 1.

Figure 4:
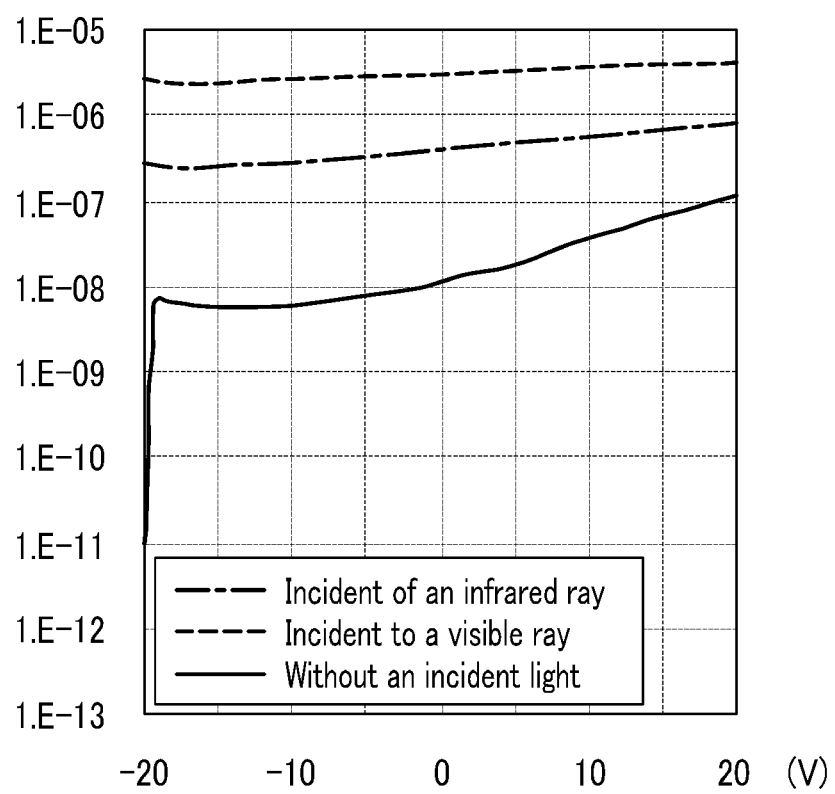
FIG. 4 is a graph showing a current when light is incident to a photosensor according to an exemplary embodiment of the present invention.
Figure 5:
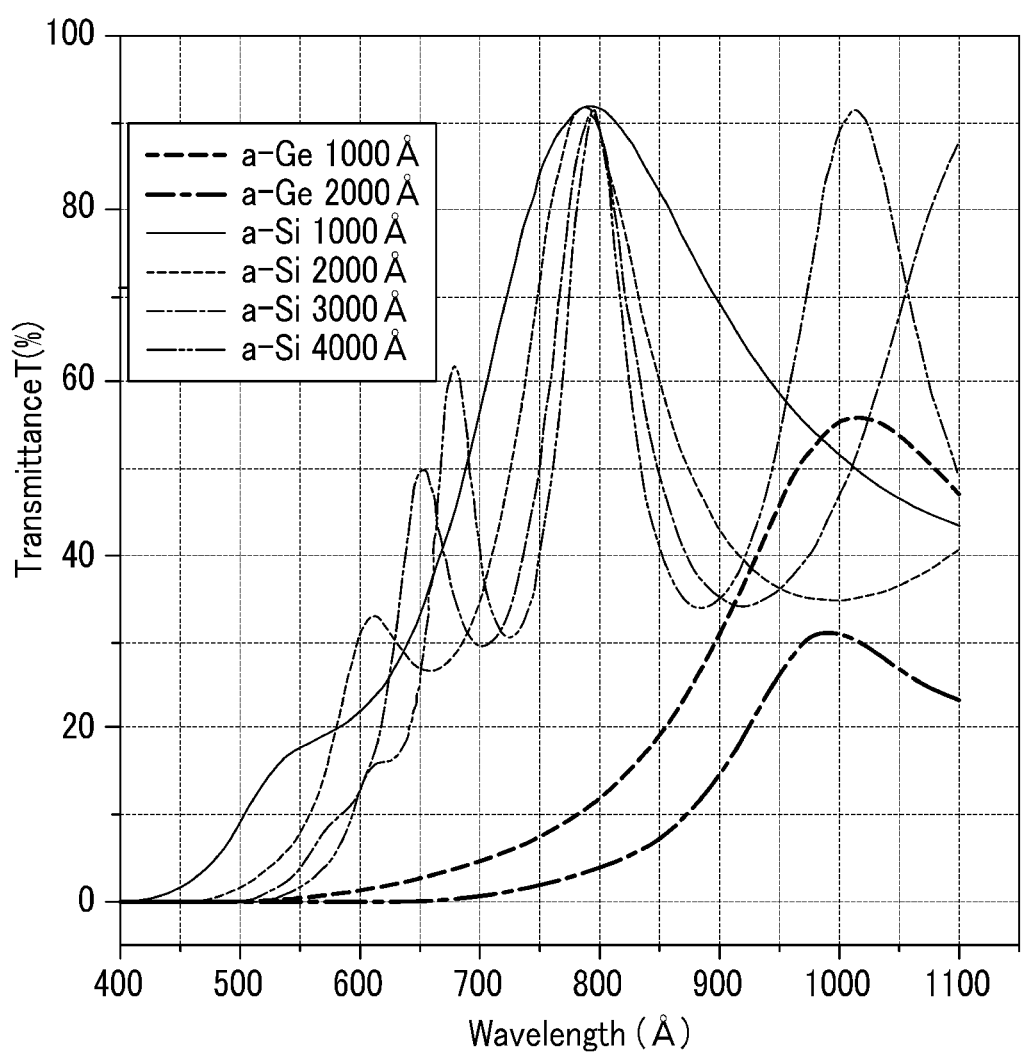
FIG. 5 is a graph showing transmittance according to a wavelength of light for a-Ge and a-Si.

FIG. 4 is a graph showing a current when light is incident to a photosensor according to an exemplary embodiment of the present invention, FIG. 5 is a graph showing transmittance according to a wavelength of light for a-Ge and a-Si, and Table 1 below is a table showing a theoretical value according to light incident to a photosensor according to an exemplary embodiment of the present invention.

If visible rays are incident to the first photo-sensing member 252 from the outside, a leakage current is generated such that the resistance of the first electrode 277 is decreased. Referring to FIG. 4, it may be confirmed that the current when the visible ray is incident is larger than the current when the light is not incident. To realize this characteristic, the first photo-sensing member 252 may be made of amorphous silicon (a-Si). The amorphous silicon (a-Si) is a material having high quantum efficiency for a visible ray region such that it has high sensitivity to the visible rays even though the infrared rays are incident together therewith. Here, the first photo-sensing member 252 may be made of materials other than amorphous silicon (a-Si), and a material having high quantum efficiency for the visible ray region is possible.

If the infrared rays are incident to the second photo-sensing member 300 from the outside, a leakage current is generated such that the resistance of the second electrode 310 is decreased. Referring to FIG. 4, it may be confirmed that the current when the infrared rays are incident is larger than the current when the light is not incident. To realize this characteristic, the second photo-sensing member 300 may be made of amorphous silicon germanium (a-SiGe). The amorphous silicon germanium (a-SiGe) is a material having high quantum efficiency for the infrared ray region. Here, the second photo-sensing member 300 may be made of materials other than amorphous silicon germanium (a-SiGe), and a material having high quantum efficiency for the infrared ray region is possible.

The second photo-sensing member 300 is disposed on the first photo-sensing member 252 such that the infrared rays first pass through the first photo-sensing member 252 before being sensed at the second photo-sensing member 300 to. Referring to FIG. 5, when the first photo-sensing member 252 is formed with amorphous silicon (a-Si), it may be confirmed that the infrared rays are sufficiently able to pass through the first photo-sensing member 252.

Whether the light is incident to the photosensor of the present invention and light of any region is incident is determined by comparing a measured value of the total resistance of the first electrode 277 and the second electrode 310 with a theoretical value.

TABLE 1

| Division | Resistance of first electrode 277 | Resistance of second electrode 310 | Total resistance (Rtot) |
| --- | --- | --- | --- |
| Case that light is not incident | R1a | R2a | 1/(1/R1a + 1/R2a) |
| Only incident visible rays | R1b | R2a | 1/(1/R1b + 1/R2a) |
| Only incident infrared rays | R1a | R2b | 1/(1/R1a + 1/R2b) |
| Incident infrared rays and visible rays | R1b | R2b | 1/(1/R1b + 1/R2b) |

If the measured value of the total of the resistance of the first electrode 277 and the second electrode 310 corresponds to the sum of the resistance R1a when the visible ray is not incident to the first electrode 277 and the resistance R2a when the infrared ray is not incident to the second electrode 310, it is determined that the visible ray and the infrared are not incident.

If the measured value of the total of the resistance of the first electrode 277 and the second electrode 310 corresponds to the sum of the resistance R1b when the visible rays are incident to the first electrode 277 and the resistance R2a when the infrared rays are not incident to the second electrode 310, it is determined that only the visible rays are incident.

If the measured value of the total of the resistance of the first electrode 277 and the second electrode 310 corresponds to the sum of the resistance R1a when the visible rays are not incident to the first electrode 277 and the resistance R2b when the infrared rays are incident to the second electrode 310, it is determined that only the infrared rays are incident.

If the measured value of the total of the resistance of the first electrode 277 and the second electrode 310 corresponds to the sum of the resistance R1b when the visible rays are incident to the first electrode 277 and the resistance R2b when the infrared rays are incident to the second electrode 310, it is determined that both the visible rays and the infrared rays are incident.

In the photosensor according to an exemplary embodiment of the present invention, a visible light blocking member 290, which blocks visible rays, may be further formed under the second photo-sensing member 300. The visible light blocking member 290 will be described with reference to FIG. 5 and FIG. 6.

Figure 6:
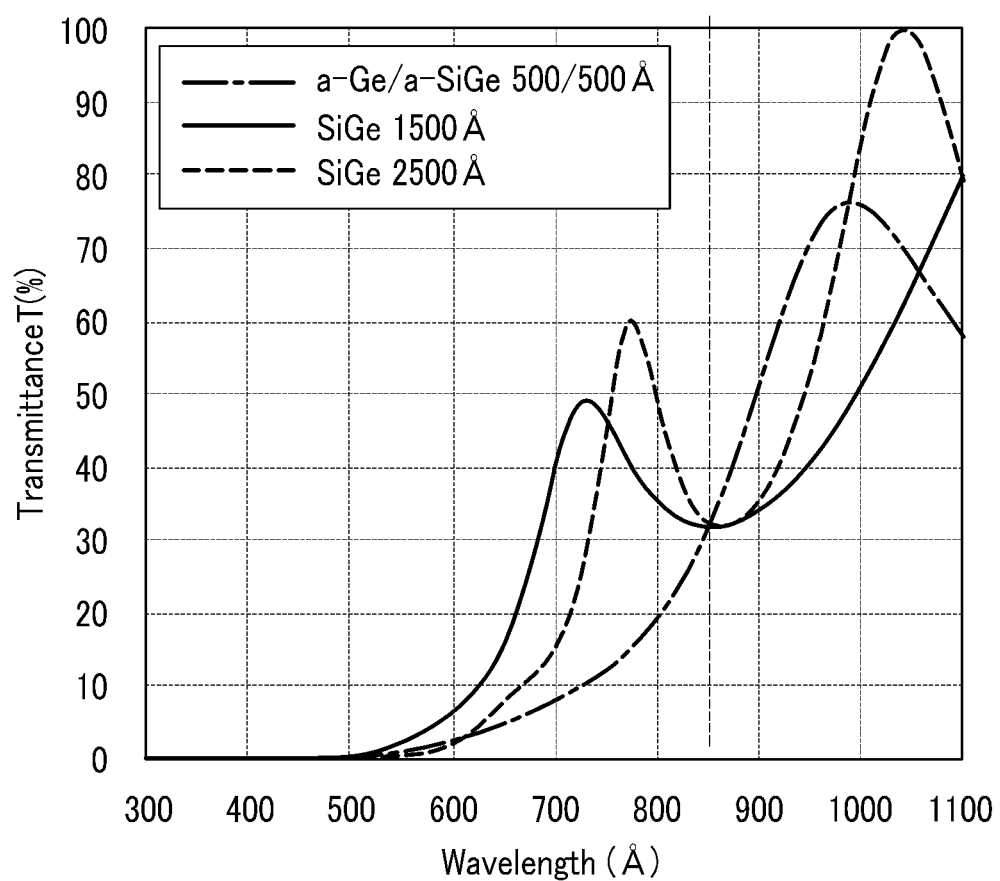
FIG. 6 is a graph showing transmittance according to a wavelength of light for SiGe and Ge/SiGe.

FIG. 5 is a graph showing transmittance according to a wavelength of light for a-Ge and a-Si, and FIG. 6 is a graph showing transmittance according to a wavelength of light for SiGe and Ge/SiGe.

The second photo-sensing member 300 has high quantum efficiency for the infrared region, however it may also have high quantum efficiency for the visible ray region such that it is influenced by the visible rays. Accordingly, the visible light blocking member 290 may be formed to prevent the visible rays from being incident to the second photo-sensing member 300.

Here, the visible light blocking member 290 may be made of amorphous germanium (a-Ge). Referring to FIG. 5, it may be confirmed that the infrared rays are well passed through amorphous germanium (a-Ge), however a small amount of the visible rays is passed. The visible light blocking member 290 may be made of a compound of amorphous germanium instead of amorphous germanium (a-Ge), and a material through which the infrared rays are well passed and a small amount of the visible rays is passed is possible.

Referring to FIG. 6, compared with the case that only the second photo-sensing member 300 made of amorphous silicon germanium (a-SiGe) is formed, when the visible light blocking member 290 made of amorphous germanium (a-Ge) is formed and the second photo-sensing member 300 made of amorphous silicon germanium (a-SiGe) is formed thereon, it may be confirmed that the visible ray region is blocked.

A light blocking member 320 may be further formed on the first thin film transistor TFT1 and the second electrode 310 of the photosensor according to an exemplary embodiment of the present invention. When the photosensor senses infrared rays and visible rays from within, the first photo-sensing member 252 or the second photo-sensing member 300 is reacted by the current that is generated such that it is misjudged that the light is incident from the outside. To prevent this, the light blocking member 320 prevents light that is generated inside from being incident to the first and second photo-sensing members 252 and 300.

The photo-sensor according to an exemplary embodiment of the present invention may further include a storage capacitor formed by overlapping a first storage electrode 279 connected to the first electrode 277 and a second storage electrode 314 connected to the second electrode 310 via the first passivation layer 280 interposed therebetween. The first passivation layer 280 has a contact hole 283 formed on a portion overlapping the first electrode 277 and the second storage electrode 314 and connecting them to each other. The storage capacitor may be omitted, and if the storage capacitor is not formed the aperture ratio may be increased.

Hereinafter, a manufacturing method of a photosensor according to an exemplary embodiment of the present invention will be described with reference to the accompany drawings.

FIG. 7A to FIG. 7I are cross-sectional views showing a manufacturing method of a photosensor according to an exemplary embodiment of the present invention.

Figure 7A:
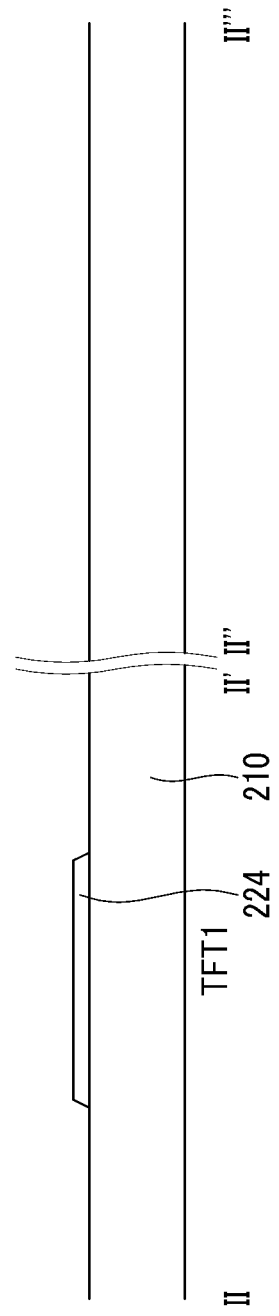

As shown in FIG. 7A, the first gate electrode 224, which may be made of a conductive material such as molybdenum with a singular or a multilayer structure, is formed on the first substrate 210, which may be made of transparent glass or plastic.

Figure 7B:
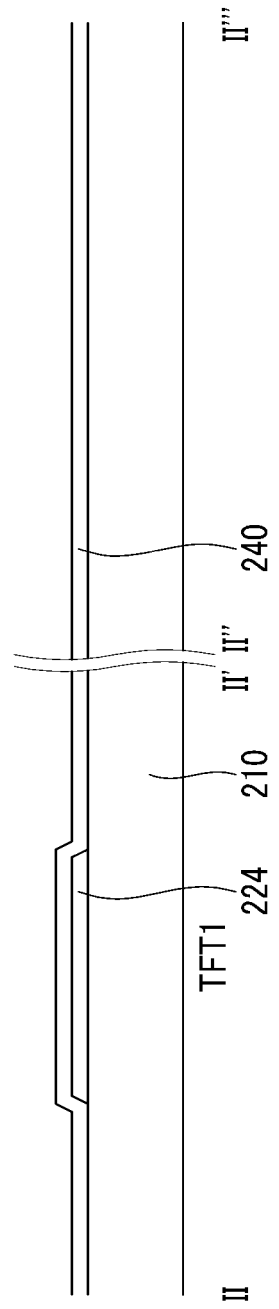

As shown in FIG. 7B, the first gate insulating layer 240, which may be made of an insulating material such as silicon oxide (SiOx) or silicon nitride (SiNx), is formed on the whole surface of the first substrate 210 including the first gate electrode 224.

Figure 7C:
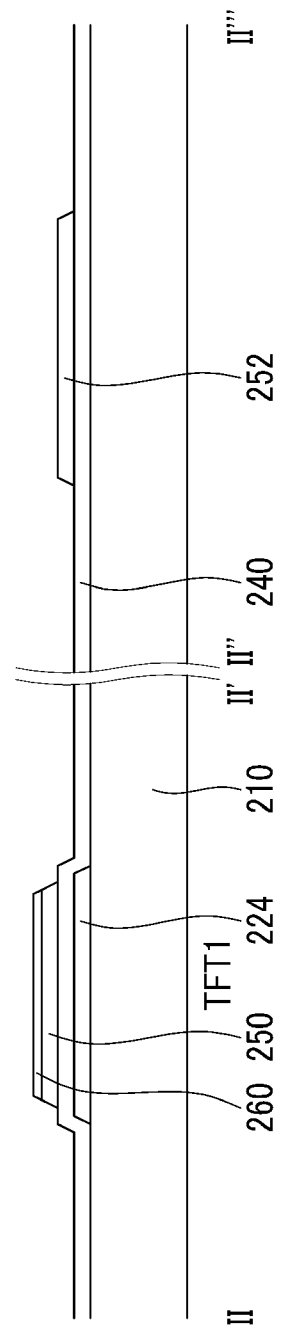

As shown in FIG. 7C, amorphous silicon (a-Si) and a conductive impurity (n+) layer are sequentially deposited on the first gate insulating layer 240 and patterned by using a slit mask or a half-tone mask. Accordingly, the first semiconductor layer 250 is formed on the first gate insulating layer 240, the first ohmic contact layer 260 is formed on the first semiconductor layer 250, and simultaneously the first photo-sensing member 252 spaced apart from and close to the first semiconductor layer 250 is formed.

The first semiconductor layer 250 and the first photo-sensing member 252 may be made of amorphous silicon (a-Si), and the first ohmic contact layer 260 is made of the conductive impurity (n+) layer. Here, the first photo-sensing member 252 may be made of materials other than amorphous silicon (a-Si), and a material having high quantum efficiency for the visible ray region is possible. In this case, the first semiconductor layer 250 may still be made of amorphous silicon (a-Si), or it may be made of the material used for the first photo-sensing member 252 when that material is appropriate as a TFT semiconductor layer.

Figure 7D:
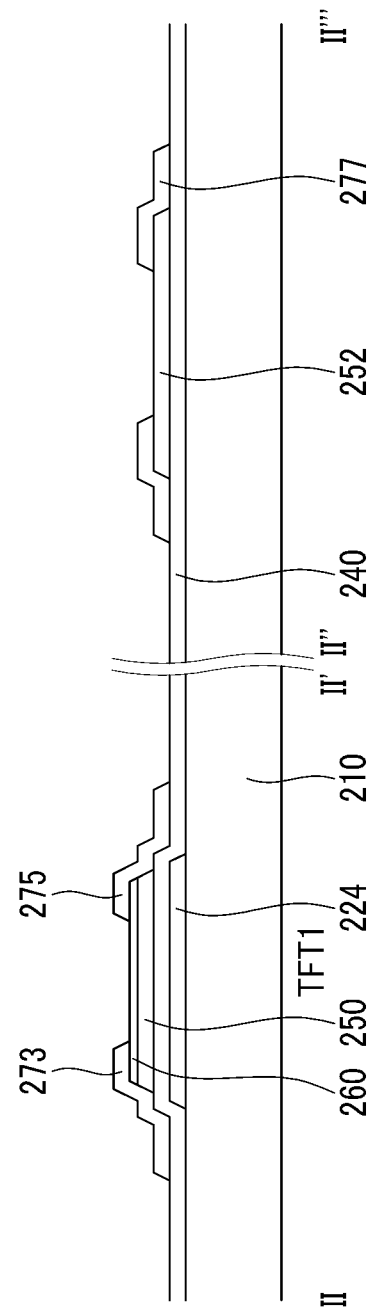

As shown in FIG. 7D, the first source electrode 273 and the first drain electrode 275, which may be made of a conductive material such as molybdenum and spaced apart from each other, are formed on the first ohmic contact layer 260, and simultaneously the first electrode 277, which may also be made of a conductive material such as molybdenum, is formed on the first photo-sensing member 252.

The first electrode 277 encloses the first photo-sensing member 252, and is connected to the first drain electrode 275.

Figure 7E:
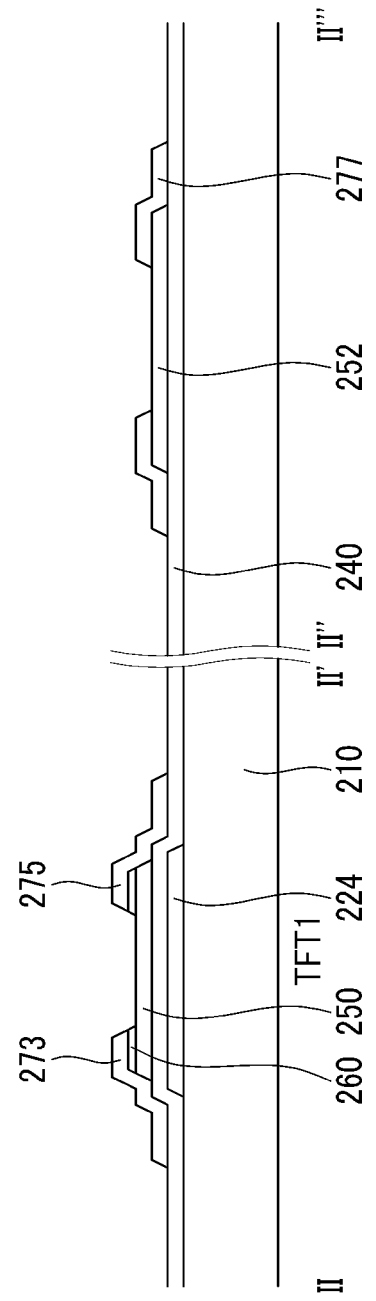

As shown in FIG. 7E, the portion of the ohmic contact layer 260 positioned between the first source electrode 273 and the first drain electrode 275 is removed, thereby forming a channel in the first semiconductor layer 250.

As shown in FIG. 7F, the first passivation layer 280, which may be made of an organic or inorganic insulating material, is formed on the first source electrode 273, the first drain electrode 275, the first photo-sensing member 252, and the first electrode 277.

As shown in FIG. 7G, amorphous germanium (a-Ge) and amorphous silicon germanium (a-SiGe) are sequentially deposited on the first passivation layer 280 and then patterned. Accordingly, the visible light blocking member 290, which is disposed on the first passivation layer 280, and the second photo-sensing member 300, which is disposed on the visible light blocking member 290, may be simultaneously formed by using one mask.

The visible light blocking member 290 may be made of amorphous germanium (a-Ge), and the second photo-sensing member 300 may be made of amorphous silicon germanium (a-SiGe). Here, the visible light blocking member 290 may be made of a compound of amorphous germanium instead of amorphous germanium (a-Ge), and a material through which the infrared region is well transmitted and the visible ray region is little transmitted is possible. Also, the second photo-sensing member 300 may be made of materials other than amorphous silicon germanium (a-SiGe), and a material having high quantum efficiency for the infrared region is possible.

Figure 7H:
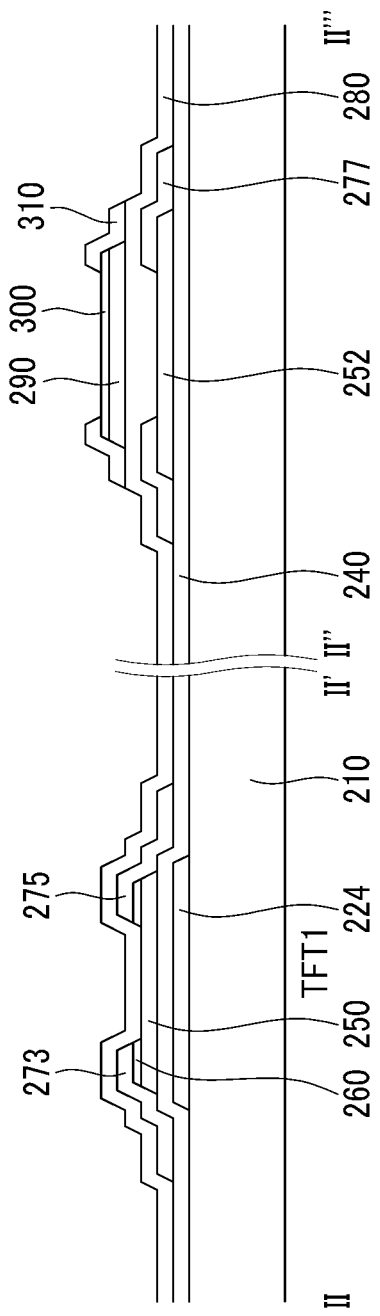

As shown in FIG. 7H, the second electrode 310 is formed on the second photo-sensing member 300. The second electrode 310 encloses the second photo-sensing member 300. The second electrode 310 may be made of a conductive material such as molybdenum. Although not shown in FIG. 7H, a contact hole exposing a portion of the first electrode 277 is formed in the first passivation layer 280 before forming the second electrode 310, and the first electrode 277 and the second electrode 310 are connected to each other through the contact hole.

Figure 7I:
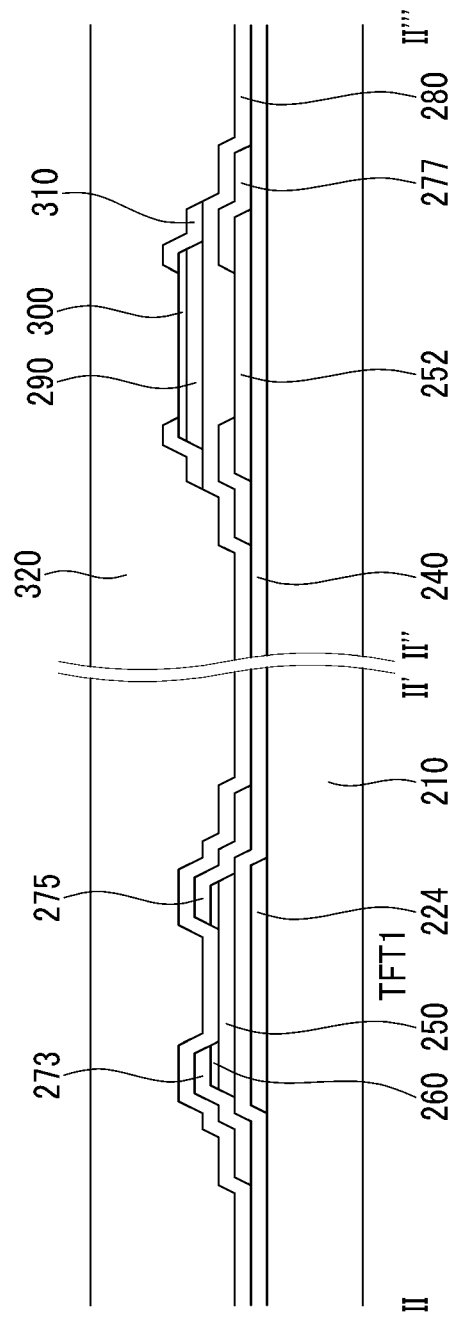

As shown in FIG. 7I, a light blocking member 320 may be further formed on the first thin film transistor TFT1 and the second electrode 310 of the photosensor according to an exemplary embodiment of the present invention. The light blocking member 320 prevents light that is generated from within from being incident to the first and second photo-sensing members 252 and 300. The light blocking member 320 may be made of an opaque material, such as material used to make a black matrix.

Hereinafter, a liquid crystal display including a photosensor according to an exemplary embodiment of the present invention will be described with reference to the drawings.

Figure 8:
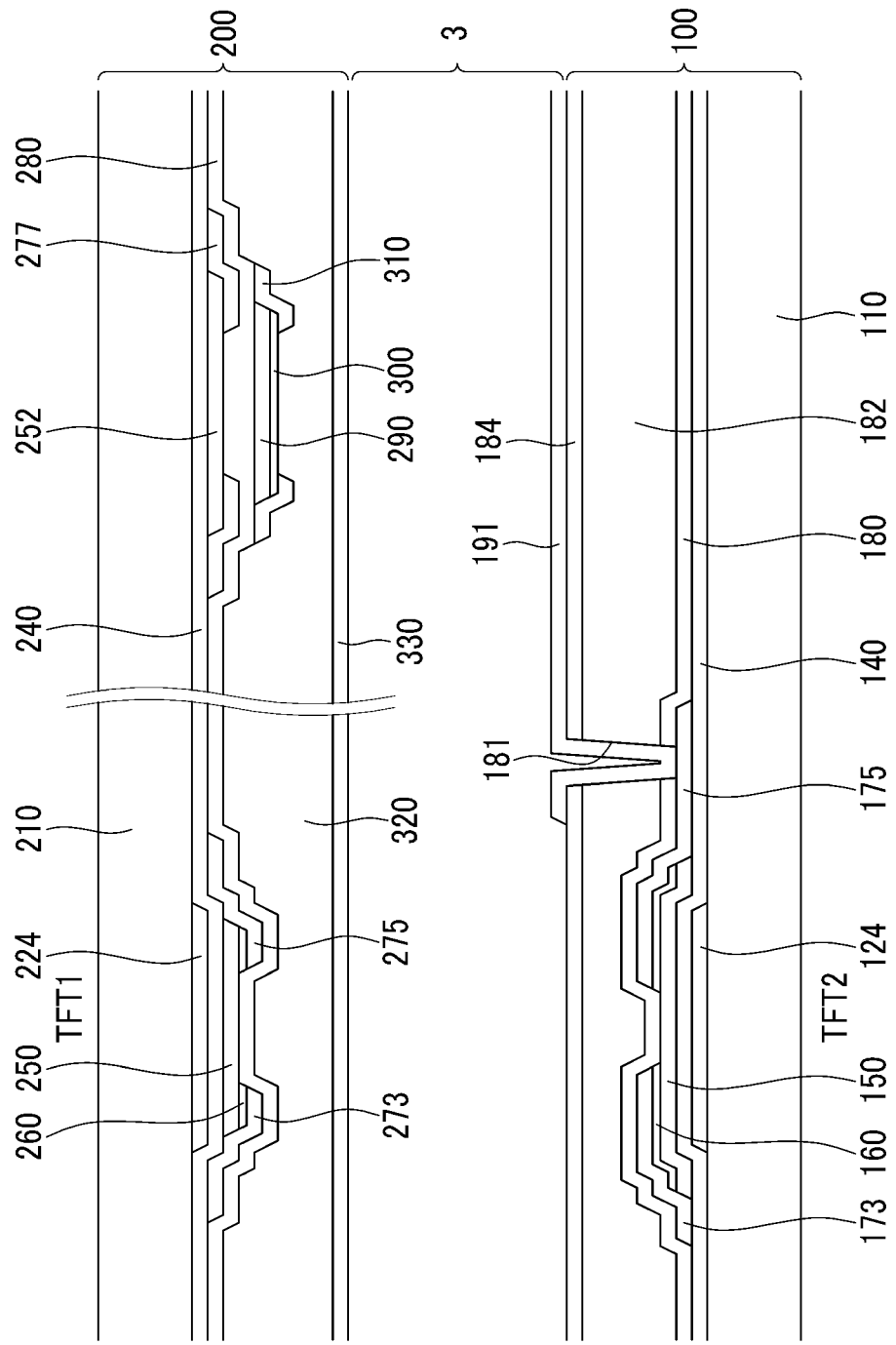
FIG. 8 is a cross-sectional view of a liquid crystal display including a photosensor according to an exemplary embodiment of the present invention.

FIG. 8 is a cross-sectional view of a liquid crystal display including a photosensor according to an exemplary embodiment of the present invention.

A liquid crystal display according to an exemplary embodiment of the present invention includes a photosensor substrate 200 and a thin film transistor substrate 100 including a plurality of pixels, and a liquid crystal layer 3 disposed between the photosensor substrate 200 and the thin film transistor substrate 100. The photosensor substrate 200 includes constituent elements sensing a touch and an image, and the thin film transistor substrate 100 includes constituent elements for displaying images.

The photosensor substrate 200 includes the first substrate 210, which may be made of transparent glass or plastic, a gate line (not shown) and a data line (not shown) formed on the first substrate 210 and insulated from and intersecting each other, the first thin film transistor TFT1 connected to the gate line and the data line, the first photo-sensing member 252 formed on the first substrate 210, the first electrode 277 connected to the first photo-sensing member 252, the first passivation layer 280 formed on the first thin film transistor TFT1, the first photo-sensing member 252, the first electrode 277, and the second photo-sensing member 300 formed on the first passivation layer 280, and the second electrode 310 connected to the second photo-sensing member 300.

The first thin film transistor TFT1 includes the first gate electrode 224 protruded from the gate line, the first source electrode 273 protruded from the data line toward the first gate electrode 224, and the first drain electrode 275 spaced apart from and facing the first source electrode 273.

The first gate insulating layer 240 is formed on the whole surface of the first substrate 210 including the first gate electrode 224, the island-shaped first semiconductor layer 250 is formed on the first gate insulating layer 240 at a position corresponding to the first gate electrode 224, and the first ohmic contact layers 260 facing in pairs are formed on the first semiconductor layer 250.

The first photo-sensing member 252 is formed on the first substrate 210 to be disposed close to the first thin film transistor TFT1. The first photo-sensing member 252 may be made of amorphous silicon (a-Si). The first photo-sensing member 252 may be made with other materials having high quantum efficiency for the visible ray region.

The first electrode 277 is formed on the first photo-sensing member 252 to enclose the first photo-sensing member 252, and it is connected to the first drain electrode 275 of the first thin film transistor TFT1.

The second photo-sensing member 300 is formed on the first passivation layer 280 at a position to correspond to the position of the first photo-sensing member 252. The second photo-sensing member 300 may be made of amorphous silicon germanium (a-SiGe). The second photo-sensing member 300 may be made with other materials having high quantum efficiency for the infrared ray region.

The second electrode 310 is formed on the second photo-sensing member 300 to enclose the second photo-sensing member 300.

Although not shown, the first passivation layer 280 may have at least one first contact hole overlapping the first electrode 277 and the second electrode 310, and the first electrode 277 and the second electrode 310 are connected through the at least one first contact hole.

The visible light blocking member 290, which blocks visible rays, may be formed under the second photo-sensing member 300. The visible light blocking member 290 may be made of amorphous germanium (a-Ge). The visible light blocking member 290 may alternatively be made of a compound of amorphous germanium instead of amorphous germanium (a-Ge), and a material through which the infrared ray region is well passed and the visible ray region is little passed is possible.

The light blocking member 320 may be formed on the first thin film transistor TFT1 and the second electrode 310 of the photosensor. A backlight unit (not shown) may be provided outside the thin film transistor substrate 100 such that at least one of white light and infrared rays may be incident to the inside of liquid crystal display, and this light may influence the first and second photo-sensing members 252 and 300 without the presence of the light blocking member 320.

A common electrode 330 may be further formed on the whole surface of the first substrate 210 including the light blocking member 320. In the present exemplary embodiment, the common electrode 330 is formed on the first substrate 210, however the common electrode 330 may alternatively be formed on a second substrate 110.

The thin film transistor substrate 100 includes the second substrate 110, which may be made of transparent glass or plastic, a gate line (not shown) and a data line (not shown) formed on the second substrate 110 and insulated from and intersecting each other, the second thin film transistor TFT2 connected to the gate line and the data line, and a pixel electrode 191 connected to the second thin film transistor TFT2 and formed in the pixel.

The second thin film transistor TFT2 includes a second gate electrode 124 protruded from the gate line, a second source electrode 173 protruded from the data line toward the second gate electrode 124, and a second drain electrode 175 spaced apart from the second gate electrode 124.

A second gate insulating layer 140 is formed on the whole surface of the second substrate 110 including the second gate electrode 124, an island-shaped second semiconductor layer 150 is formed on the second gate insulating layer 140 and at a position corresponding to the position of the second gate electrode 124, and second ohmic contact layers 160 facing each other in pairs on the second semiconductor layer 150.

A second passivation layer 180 may be further formed on the second thin film transistor TFT2, and the second passivation layer 180 may have a contact hole 181 exposing a portion of the second drain electrode 175.

The pixel electrode 191 is connected to the second drain electrode 175 through the contact hole 181. An electric field is formed between the pixel electrode 191 and the common electrode 330, and thereby liquid crystal molecules of the liquid crystal layer 3 are arranged.

A color filter 182 may be formed on the passivation layer 180 for each pixel, and an overcoat 184 may be formed on the color filter 182. In the present exemplary embodiment, the color filter 182 is formed on the second substrate 110, however the color filter 182 may alternatively be formed on the first substrate 210.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A photosensor, comprising:
   a substrate;
   a gate line and a data line disposed on the substrate;
   a thin film transistor connected to the gate line and the data line;
   a first photo-sensing member disposed on the substrate;
   a first electrode connected to the thin film transistor and the first photo-sensing member;
   a second photo-sensing member disposed on the first photo-sensing member; and
   a second electrode connected to the first electrode and the second photo-sensing member.

2. The photosensor of claim 1, wherein the first photo-sensing member and the second photo-sensing member are configured to generate a leakage current in response to incident light.

3. The photosensor of claim 2, wherein the first photo-sensing member is configured to generate the leakage current in response to visible rays.

4. The photosensor of claim 3, wherein the first photo-sensing member comprises amorphous silicon.

5. The photosensor of claim 2, wherein the second photo-sensing member is configured to generate the leakage current in response to infrared rays.

6. The photosensor of claim 5, wherein the second photo-sensing member comprises amorphous silicon germanium.

7. The photosensor of claim 2, wherein a resistance of the first electrode and a resistance of the second electrode change in response to the incident light.

8. The photosensor of claim 7, wherein the resistance of the first electrode decreases in response to incident visible rays, and the resistance of the second electrode decreases in response to incident infrared rays.

9. The photosensor of claim 8, wherein:
   the measured value of the total of the resistance of the first electrode and the second electrode corresponds to the total of the resistance of the first electrode when the visible rays are not incident and the resistance of the second electrode when the infrared rays are not incident when the visible rays and the infrared rays are not incident;

the measured value of the total of the resistance of the first electrode and the second electrode corresponds to the total of the resistance of the first electrode when the visible rays are incident and the resistance of the second electrode when the infrared rays are not incident when only the visible rays are incident;

the measured value of the total of the resistance of the first electrode and the second electrode corresponds to the total of the resistance of the first electrode when the visible rays are not incident and the resistance of the second electrode when the infrared rays are incident when only the infrared rays are incident; and the measured value of the total of the resistance of the first electrode and the second electrode corresponds to the total of the resistance of the first electrode when the visible rays are incident and the resistance of the second electrode when the infrared rays are incident when both the visible rays and the infrared rays are incident.

10. The photosensor of claim 1, further comprising a visible light blocking member disposed between the second photo-sensing member and the first photo-sensing member, the visible light blocking member being configured to block visible rays.

11. The photosensor of claim 10, wherein the visible light blocking member comprises amorphous germanium or a compound of amorphous germanium.

12. The photosensor of claim 1, further comprising:
a voltage supply line to supply a bias voltage to the first electrode and the second electrode; and
a storage capacitor comprising a first terminal connected to the voltage supply line and a second terminal connected to the thin film transistor.

13. The photosensor of claim 1, further comprising a light blocking member disposed on the thin film transistor and the second electrode.

14. A photosensor, comprising:
a substrate;
a first signal line and a second signal line disposed on the substrate, the second signal line crossing and being insulated from the first signal line;
a switch connected to the first signal line and the second signal line, the switch comprising a first terminal;
a first photo-sensing member disposed on the substrate, the first photo-sensing member being configured to sense a first light and to pass a second light;
a first conductive member connected to the first terminal of the switch and the first photo-sensing member;
a second photo-sensing member disposed on the first photo-sensing member, the second photo-sensing member being configured to sense the second light having passed through the first photo-sensing member; and
a second conductive member connected to the first conductive member and the second photo-sensing member.

15. The photosensor of claim 14, further comprising a blocking member disposed between the first photo-sensing member and the second photo-sensing member, the blocking member being configured to block the first light.

16. The photosensor of claim 15, wherein the first photo-sensing member is configured to generate a leakage current in response to the first light but not generate a leakage current in response to the second light, and the second photo-sensing member is configured to generate a leakage current in response to the second light.

17. The photosensor of claim 16, wherein the first light comprises visible rays.

18. The photosensor of claim 17, wherein the first photo-sensing member comprises amorphous silicon.

19. The photosensor of claim 18, wherein the second light comprises infrared rays.

20. The photosensor of claim 19, wherein the second photo-sensing member comprises amorphous silicon germanium.

21. The photosensor of claim 20, wherein the blocking member comprises amorphous germanium or a compound of amorphous germanium.

* * * * *